United States Patent
Keshavarzi et al.

(10) Patent No.: US 6,632,686 B1
(45) Date of Patent: Oct. 14, 2003

(54) SILICON ON INSULATOR DEVICE DESIGN HAVING IMPROVED FLOATING BODY EFFECT

(75) Inventors: Ali Keshavarzi, Portland, OR (US); Siva G. Narendra, Beaverton, OR (US); James W. Tschanz, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 09/672,696

(22) Filed: Sep. 29, 2000

(51) Int. Cl.$^7$ ............................................ H01L 21/66
(52) U.S. Cl. ............................. 438/14; 438/3; 438/149
(58) Field of Search .............................. 365/156, 154, 365/175; 257/295, 300, 296; 438/3, 149, 631, 14, 11, 21; 364/491, 490, 489, 488

(56) References Cited

U.S. PATENT DOCUMENTS

| | | | | |
|---|---|---|---|---|
| 4,785,202 A | * | 11/1988 | Toyoda | 326/101 |
| 5,202,841 A | * | 4/1993 | Tani | 364/491 |
| 5,345,401 A | * | 9/1994 | Tani | 703/16 |
| 5,416,859 A | * | 5/1995 | Burns et al. | 385/3 |
| 5,579,005 A | * | 11/1996 | Moroni | 341/155 |
| 5,661,579 A | * | 8/1997 | Takahashi | 349/42 |
| 5,767,549 A | | 6/1998 | Chen et al. | |
| 5,780,341 A | * | 7/1998 | Ogura | 438/259 |
| 5,818,407 A | * | 10/1998 | Hori et al. | 345/92 |
| 5,862,086 A | * | 1/1999 | Makimura et al. | 365/200 |
| 5,909,264 A | * | 6/1999 | Fujikawa et al. | 349/49 |
| 5,933,062 A | * | 8/1999 | Kommrusch | 333/193 |
| 5,956,597 A | | 9/1999 | Furukawa et al. | |
| 5,995,398 A | * | 11/1999 | Yamauchi et al. | 363/98 |
| 6,020,222 A | | 2/2000 | Wollesen | |
| 6,043,166 A | | 3/2000 | Roitman et al. | |
| 6,058,041 A | * | 5/2000 | Golke et al. | 365/156 |
| 6,085,041 A | * | 7/2000 | Shiokama | 396/75 |
| 6,090,689 A | | 7/2000 | Sadana et al. | |
| 6,110,765 A | | 8/2000 | Manning | |
| 6,118,505 A | * | 9/2000 | Nagata et al. | 349/106 |
| 6,121,812 A | * | 9/2000 | Tsukikawa | 327/280 |
| 6,140,672 A | * | 10/2000 | Arita et al. | 257/295 |
| 6,229,170 B1 | * | 5/2001 | Sakao | 257/296 |
| 6,262,907 B1 | * | 7/2001 | Lien et al. | 365/49 |
| 6,292,907 B1 | * | 9/2001 | Miller | 714/25 |
| 6,321,365 B1 | * | 11/2001 | McBride | 716/5 |

* cited by examiner

Primary Examiner—Carl Whitehead, Jr.
Assistant Examiner—Laura M Schillinger
(74) Attorney, Agent, or Firm—Antonelli, Terry, Stout & Kraus, LLP

(57) ABSTRACT

A method is provided for designing an electronic device. This may include determining a capacitance ratio of a design of the electronic device and altering the design so as to increase the capacitance ratio of said electronic device. The capacitance ratio may be $C_{dj}/(C_{dj}+C_{sj}+C_{BOX})$, where $C_{dj}$ is a capacitance of a drain-body junction, $C_{sj}$ is a capacitance of a source-body junction and $C_{BOX}$ is a capacitance of a buried oxide layer.

26 Claims, 5 Drawing Sheets

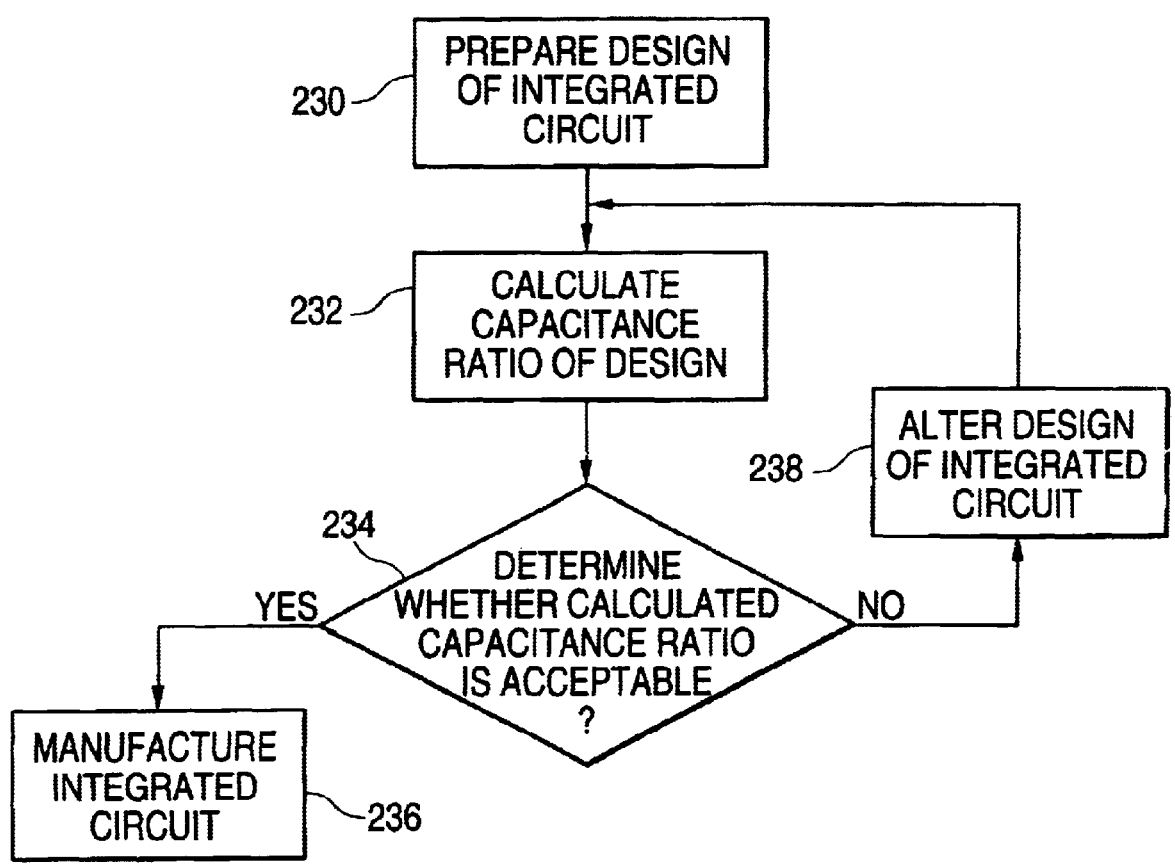

US 6,632,686 B1

SILICON ON INSULATOR DEVICE DESIGN HAVING IMPROVED FLOATING BODY EFFECT

FIELD

The present invention generally relates to the fabrication and design of devices and integrated circuits. More particularly, the present invention relates to the fabrication and design of silicon on insulator (SOI) devices.

BACKGROUND

The traditional integrated circuits fabrication process is a series of steps by which a geometric pattern or set of geometric patterns is transformed into an operating integrated circuit. An integrated circuit (IC), may include superimposed layers of conducting, insulating, and transistor-forming materials, usually formed on a silicon wafer substrate. By arranging, constructing and fabricating predetermined geometric shapes in each of these superimposed layers, an integrated circuit that performs the desired function may be constructed. The overall fabrication process typically includes of the patterning of a particular sequence of successive layers using lithography to define them and etch by various chemicals to remove portions of the various layers. Many different processes exist for creating a pattern on the underlying silicon wafer with different processes being specifically adapted to produce the desired type of integrated circuit.

Processes have been developed for fabricating integrated circuit devices commonly known as silicon on insulator (SOI) devices. SOI devices are semiconductor devices fabricated within a relatively thin silicon layer that overlies an electrically insulating region formed over a substrate material. This insulating region may include, for example, a layer of $SiO_2$ deposited or grown over a semiconductor substrate material such as silicon or gallium arsenide. The SOI fabrication process allows circuit devices to be created that are electrically isolated from the underlying substrate.

SOI devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

SOI has been proposed for high performance CMOS ICs with a floating body node. Keeping the body of the SOI floating may provide a better circuit delay and since no body contact is necessary, then better front-end transistor dominated circuit density may be achieved. A floating body node causes the floating body effect (FBE), which makes circuit design challenging. One example of floating body effect is the history effect that a designer needs to margin (guard band) for when designing integrated circuits. History effect means that the circuit delay is a function of the previous status of the circuit as determined by switching of the gate and drain transistor signals. Floating body effect modulates the device threshold voltage in static CMOS circuits, for example, such that a threshold voltage change causes the device drive current to vary, which in turn causes changes in circuit delay. History effect refers to this variability in delay and is determined based on input history and conditions prior to switching activity. The history effect of the delay in SOI is a design obstacle for adopting SOI technology.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto.

The following represents brief descriptions of the drawings wherein like reference numerals represent like elements and wherein:

FIG. 6 is a flowchart showing an example embodiment of the present invention.

DETAILED DESCRIPTION

Figure 1:
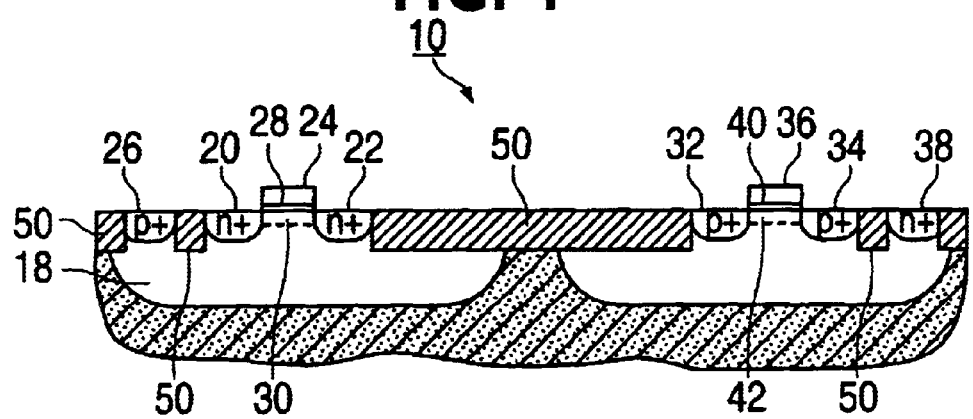
FIG. 1 is a side cross-sectional view of a portion of a CMOS wafer.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given although the present invention is not limited to the same. Also, well known power/ground connections to ICs and other components may not be shown within the figures for simplicity of illustration and discussion, and so as not to obscure the invention. Where specific details (e.g., circuits, flowcharts) are set forth in order to describe example embodiments of the invention, it should be apparent to one skilled in the art that the invention can be practiced without these specific details. Embodiments of the present invention will now be described with respect to the accompanying drawings.

FIG. 1 shows a portion of a CMOS (non-SOI) wafer 10 including a substrate 12, an n-well 14, a p-well 18 and isolation regions 50. The wafer 10 may further include an n+ source region 20, an n+ drain region 22, a polysilicon gate contact 24, a p-well contact 26 and a gate oxide 28 between the polysilicon gate contact 24 and the p-well 18. In this embodiment, the device is symmetrical and the source region and drain region are interchangeable. An n-channel 30 may be produced between the source region 20 and the drain region 22. The wafer 10 may also include a p+ source region 32, a p+ drain region 34, a polysilicon gate contact 36, an n-well contact 38 and a gate oxide 40 between the polysilicon gate contact 36 and the n-well 14. In this embodiment, the device is symmetrical and the source region and drain region are interchangeable. A p-channel 42 may be produced between the source region 32 and the drain region 34.

Designation of a particular device as a p-channel device or an n-channel device may depend on the type of fabrication process used to create the device. The substrate 12 may be any type of semiconductor material known to those skilled in the art. The various wells and contacts may be created by using different types of constituents when the wafer is being fabricated. In normal operation for a CMOS configuration, the n-well contact 38 may be coupled to $V_{DD}$ and the p-well contact 26 may be coupled to ground.

Figure 2:
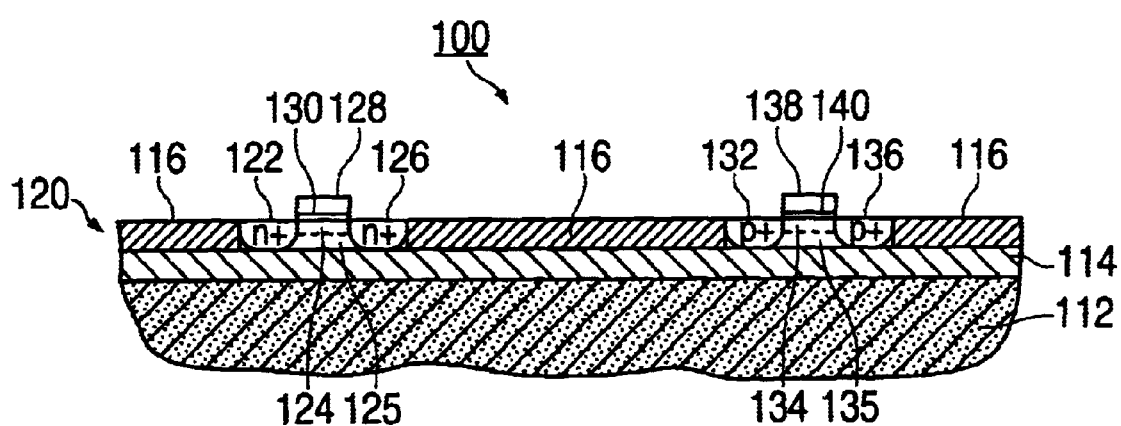
FIG. 2 is a side cross-sectional view of a portion of an SOI wafer.

FIG. 2 shows a portion of an SOI wafer 100 according to an example embodiment of the present invention. Other embodiments and configurations are also within the scope of the present invention. The wafer 100 may include a substrate 112, a buried oxide layer 114 (also called BOX), isolation regions 116 and an active region 120. The active region 120 may be a thin layer of silicon and include an n+ source region 122, an n+ drain region 126, a polysilicon gate contact 128 and a gate oxide 130 between the polysilicon gate contact 128 and a body region 125 (also called the body). An n-channel 124 may be produced in the body region 125 between the source region 122 and the drain region 126. The active region 120 may further include a p+ source region 132, a p+ drain region 136, a polysilicon gate contact 138 and a gate oxide 140 between the polysilicon gate contact 138 and a body region 135 (also called the body). A p-channel 134 may be produced in the body region 135 between the source region 132 and the drain region 136.

The source regions 122 and 132 and the drain regions 126 and 136 may abut the buried oxide layer 114. The device isolation regions 116 and the buried oxide layer 114 serve to electrically isolate the devices. For example, the isolation region 116 may isolate the device including the source region 122 and the drain region 126 from the device including the source region 132 and the drain region 136. The isolation region 116 and the buried oxide layer 114 help prevent electrical charge from being transferred to and from the devices through the substrate 112.

In an SOI device, the circuit elements may be established by regions of field oxide and regions of a monocrystalline semiconductor layer that are doped as appropriate with n-type or p-type conductivity dopants. For example, for an n-channel transistor, the isolated silicon layer may include the body region 125 having a p-type dopant with the body region 125 disposed between the source region 122 and the drain region 126, each of which are doped with an n-type dopant to form an NMOS transistor. On the other hand, for a p-channel transistor, the isolated silicon layer may include the body region 135 having an n-type dopant with the body region 135 disposed between the source region 132 and the drain region 136, each of which are doped with a p-type dopant to form a PMOS transistor.

One feature of SOI devices is that the voltage of the body region tends to vary or "float". As discussed above, this causes a floating body effect (FBE). The body potential may change due to capacitive coupling or by DC leakage currents as will be explained. Capacitive coupling occurs through coupling of voltage from the source, drain, back gate and gate nodes (node potentials). Capacitance of the back oxide (BOX) can be ignored due to its relatively thick oxide thickness that results in a low capacitance value. The body potential may also be influenced by DC leakage currents resulting from impact ionization and junction leakages such as a source to body diode current and a drain to body diode current. The body potential converges to a potential value between the source voltage and the drain voltage. In static CMOS circuits, for example, threshold voltage change may cause the device drive current to vary, which in turn leads to changes in circuit delay.

Embodiments of the present invention will now be described with respect to an NMOS transistor similar to the NMOS transistor shown in FIG. 2. Other embodiments and configurations of an NMOS transistor are also within the scope of the present invention. Further, the present invention is equally applicable to a PMOS transistor such as the PMOS transistor shown in FIG. 2.

The potential of the body region is influenced based on how fast the gate and the circuit is switching as will be described. The NMOS transistor may operate under a very slow switching condition (hereafter also called a DC or first switch condition), under a fast switching condition (hereafter also called an AC or second switch condition) or somewhere in between these two conditions. The voltage of the floating body may be dependent on the type of switching conditions.

Figure 3:
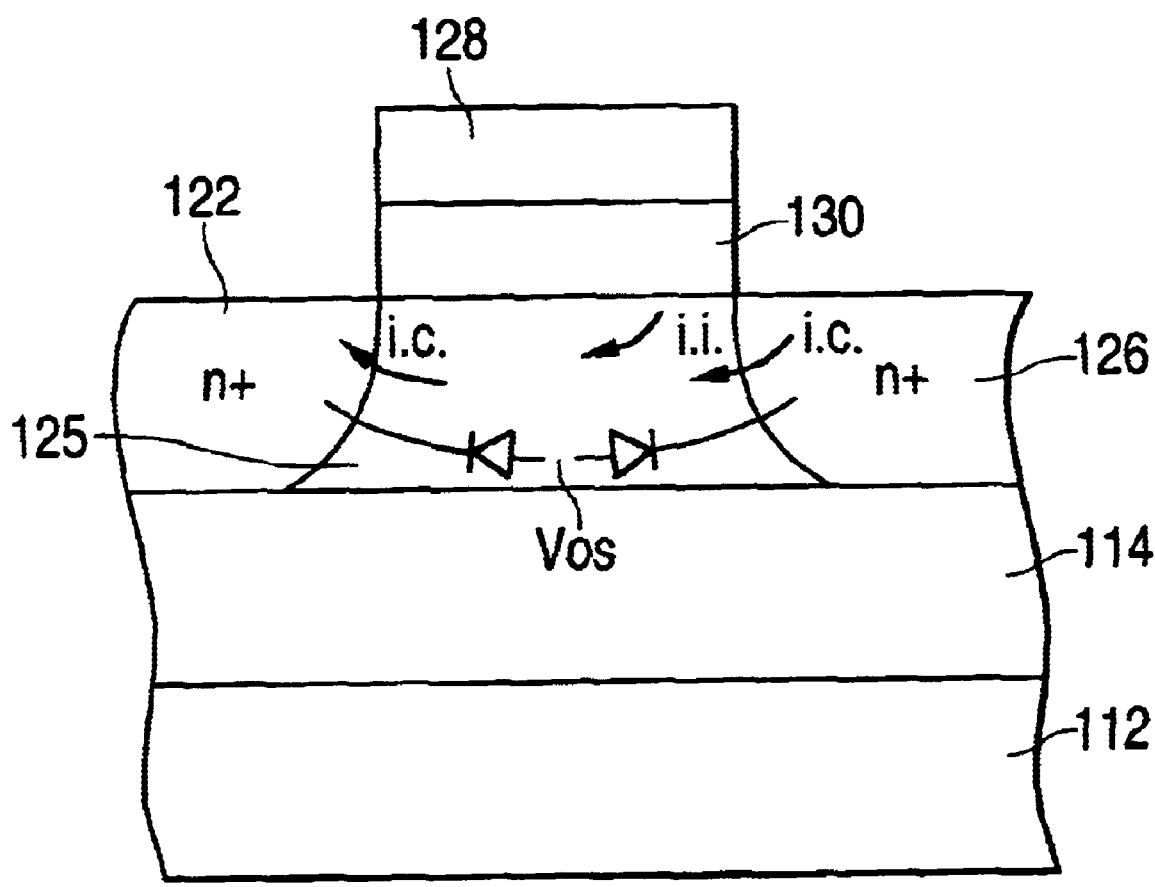
FIG. 3 is a side cross-sectional view of an NMOS transistor showing leakage currents and impact ionization.

In an NMOS transistor operating under a DC switching condition, the source region 122 may be coupled to ground while the drain region 126 may be coupled to $V_{DD}$ (or other type of positive voltage). Because the body region 125 is of p-type dopant and the source region 122 and the drain region 126 are both of n+ dopants, a p-n junction is formed between the body region 125 and the source region 122 and a p-n junction is formed between the body region 125 and the drain region 126. FIG. 3 shows two diodes representing the p-n junction between the body region 125 and the source region 122 and the p-n junction between the body region 125 and the drain region 126. Upon application of the voltage to the gate contact 128, a channel region 124 may be formed at the top of the body region 125 near the gate oxide 130. Depending on the voltage applied, different types of leakage current (labeled l.c.) may occur between the body region 125 and the source region 122 and between the body region 125 and the drain region 126. Impact ionization (labeled i.i) within the body region 125 may also influence the voltage of the floating body. A combination of these leakage currents and the impact ionization may set (or influence) the body potential (in addition to other factors such as the applied bias, the doping and the channel length). Under DC conditions in which there is slow switching, the leakage currents slowly build-up over time to influence the potential of the floating body.

Under fast switching conditions (or AC switching conditions), the potentials of the gate contact 128 and the drain region 126 are switched. The floating body effect and the resulting history effect occur, in part, due to the capacitive coupling as will now be described with respect to FIG. 4. However, unlike DC switching conditions, during rapid switching (or AC switching), the capacitive coupling between the respective regions plays a bigger role in influencing the potential of the body floating body.

Figure 4:
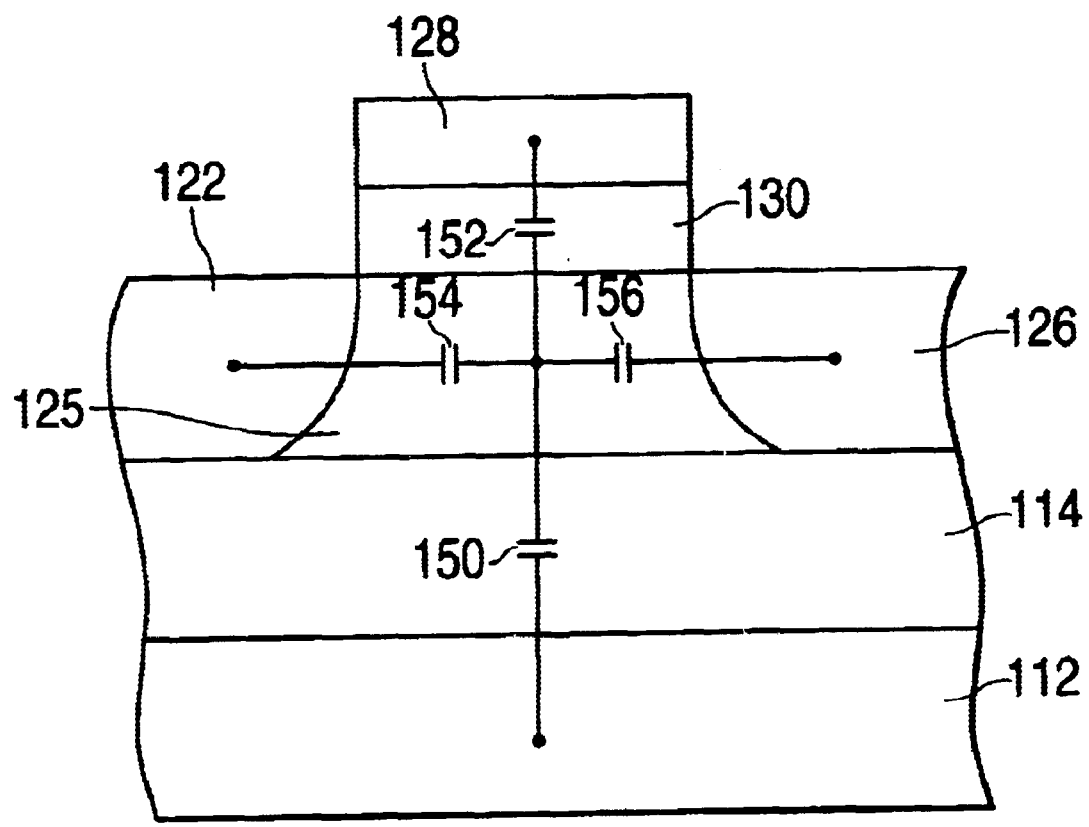
FIG. 4 is a side cross-sectional view of an NMOS transistor showing capacitive coupling between different regions.

FIG. 4 shows capacitors 150, 152, 154 and 156 that influence the history effect of the NMOS transistor. These capacitors are shown to represent the capacitive coupling between different regions. More specifically, the capacitor 150 corresponds to the capacitance between the body region 125 and the substrate 112 (i.e., the buried oxide layer 114). The capacitor 152 corresponds to the capacitance between the polysilicon gate contact 128 and the body region 125

(i.e., the gate oxide layer 130). In this example, the source region 122 and the drain region 126 are each formed of an n-type dopant whereas the body region 125 is formed of a p-type dopant. As explained above, this forms a p-n junction between the body region 125 and the source region 122 and forms a p-n junction between the body region 125 and the drain region 126. In p-n junctions, a depletion region between the p region and the n region acts as a capacitor. Thus, FIG. 4 shows a capacitor 154 between the body region 125 and the source region 122 and a capacitor 156 between the body region 125 and the drain region 126. As the depletion region increases, the capacitance decreases. On the other hand, as the depletion region decreases, the capacitance increases.

Under a steady state condition in which the NMOS transistor is switching in a periodic manner such as a steady state square wave, then the body potential may settle at a value between the values of the AC and DC conditions. In this situation, the history effect may be determined based on a comparison of AC and DC switching conditions.

Figure 5:
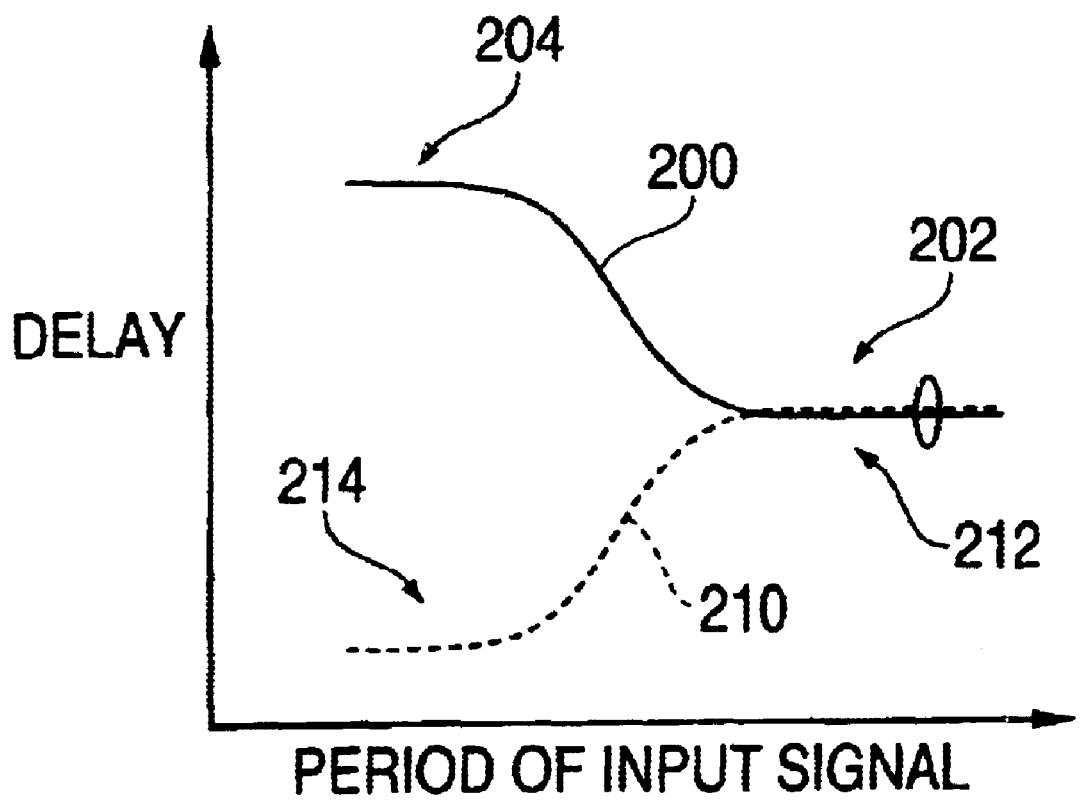
FIG. 5 is a plot of delay versus period of an input signal.

FIG. 5 shows a plot of the delay versus the period of an input signal to the transistor (or other type of integrated circuit). The input signal may correspond to a switching signal applied to the gate contact 128. FIG. 5 includes a plot (or curve) 200 of a disadvantageous embodiment showing respective data points at both a DC switching condition (shown generally as region 202), an AC switching condition (shown generally as region 204) and points in between. In this embodiment, during DC switching, the period of the input signal is long while during AC switching, the switching is fast and its period is much smaller. Accordingly, DC switching may result in advances in the speed; however, when AC switching occurs, then the transistor may perform in a slower manner. This delay needs to be taken into account when designing integrated circuits.

The difference between the delay at AC conditions and the delay at DC conditions is called the history effect. The history effect is such that the AC transient delay is dominated by capacitive coupling and is larger than the DC switch leakage dominated delay and hence the circuit operation may be slower under AC switching conditions. More specifically, for a short input period or pulse width (between 10e-8 and 10e-6 sec. input period), a maximum delay may occur where the delay is determined by the transient floating body effect and capacitive coupling. For a long input period or pulse width (greater than 10e-2 sec. input period), a minimum delay may occur where the delay is determined by the DC floating body effect (i.e., impact ionization and diode currents). This condition may be achieved if the natural floating body bias for the DC condition is at a higher forward bias potential than the AC transient. It is desirable to margin the design timing or the history effect between the AC condition (region 204) and the DC condition (region 202).

Embodiments of the present invention may obtain an improved device design such that the transistor (or other type of integrated circuit) operates as shown by the plot (or curve) 210 of an example embodiment of the present invention. Other embodiments are also within the scope of the present invention.

FIG. 5 includes a plot (or curve) 210 of an embodiment showing respective data points at both a DC switching condition (shown generally as region 212), an AC switching condition (shown generally as region 214) and points in between. In this situation, an improved device design and structure may exploit the floating body effect for a higher performance scheme during (or close to) AC switching operation. The device design may improve on the coupling capacitance (based on capacitance ratios as will be discussed below) so as to increase the amount of $V_{BS}$ (forward body potential) for the AC transient switching condition. The DC condition (shown as region 212) for this improved design may be relatively similar to the DC condition (shown as region 202). However, the AC switching condition (shown as region 214) for the improved design and structure may be greatly improved over the disadvantageous embodiment by having a lower delay so as to eliminate or reduce the negative history effect caused by the slower AC switching in the disadvantageous embodiment so, for the same leakage constraint at DC, the AC speed can be faster by this invention.

The improved design and structure may have more capacitive coupling to the body region 125 such that the body region 125 is placed at a positive potential (i.e., a forward body bias), which thereby lowers the threshold voltage and increases the speed of the resulting transistor (or other type of integrated circuit). Different embodiments for obtaining the improved design and structure will now be described. Other embodiments are also within the scope of the present invention. In order to have more capacitive coupling to the body region, it is desirable to optimize (or maximize) the following ratio (hereafter called the capacitance ratio):

$$\text{Capacitance Ratio} = C_{dj}/(C_{dj}+C_{sj}+C_{BOX})$$

While it is desirable to maximize this ratio, an improvement on the ratio is also an improvement on the device design as compared with a previous device design having a lower capacitance ratio or not even considered this ratio in device design. Once the inversion layer has been formed in the top of the well, then the gate contact 128 has basically been drained out. Accordingly, the capacitance ratio relates to the capacitance ($C_{dj}$) between the drain region 126 and the body region 125 as shown by the capacitor 156 (FIG. 4), the capacitance ($C_{sj}$) between the source region 122 and the body region 125 as shown by the capacitor 154 and the capacitance ($C_{BOX}$) of the buried oxide layer 114 as shown by the capacitor 150.

An embodiment for improving (or maximizing) the capacitance ratio and thereby eliminating (or minimizing) the negative history effect shown by the disadvantageous embodiment (i.e., plot 200) is to minimize a value of $C_{BOX}$. This may be accomplished by increasing the thickness of the buried oxide layer 114 or by reducing the dielectric constant (i.e., capacitance is proportional to dielectric constant divided by dielectric thickness) of the buried dielectric layer. By performing either of these design options (or a combination thereof), the capacitance ratio is increased meaning that more potential is coupled to the body region 125 (i.e., a forward body bias) which in turn lowers the threshold voltage. This thereby increases the speed of the transistor at the AC switching conditions and accordingly results in the data points for the region 214 of the curve 210 shown in FIG. 5. Stated differently, by increasing the SOI back oxide thickness (or reducing the dielectric constant of the oxide), the coupling from the drain region 126 to the body region 125 may be increased. This reduces the back oxide capacitance ($C_{BOX}$) and improves the capacitance ratio. This enhances the coupling to the body region 125 and increases the switching speed of SOI circuits, particularly in AC transient operation. The resulting design may produce the desired delay versus input period curve at region 214 as shown in FIG. 5.

Another embodiment for improving (or maximizing) the capacitance ratio and thereby eliminating (or minimizing)

the negative history effect is to increase the coupling from the drain region 126 to the body region 125 by minimizing (or decreasing) the value of $C_{sj}$ (i.e., the source to body junction capacitance) in the capacitance ratio. This will decrease the source junction capacitance and thereby increase the capacitance ratio. By asymmetrically doping the source region 122 and the drain region 126, the value of $C_{sj}$ may be lowered as compared to the value of $C_{dj}$ (i.e., the drain to body junction capacitance). To achieve asymmetrical doping, the doping (e.g. dose amount or energy level) may be reduced at the source sidewall side of the junction as compared with the drain sidewall side of the junction. This thereby enhances the coupling to the body region 125 by increasing the capacitance ratio. The resulting design may produce the desired delay versus input period curve at the region 215 as shown in FIG. 5.

Accordingly, embodiments of the present invention may provide a method of designing an electronic device, such as a silicon-on-insulator integrated circuit. This may include determining a capacitance ratio of a design of the electronic device and subsequently altering the design of the electronic device so as to increase the capacitance ratio of the electronic device. As described above, the capacitance ratio of the electronic device may be increased by increasing a thickness of the buried oxide layer, decreasing the dielectric constant of the buried layer, asymmetrically doping the source region and the drain region by making the source side lower doped than the drain side, and/or any combination thereof.

FIG. 6 shows a flowchart of operations for designing an electronic device (such as an integrated circuit) in accordance with an example embodiment of the present invention. Other embodiments, flowcharts and orders of operation are also within the scope of the present invention. In block 203, an initial design may be prepared of the integrated circuit. Subsequently in block 232, a capacitance ratio may be calculated for the design. This may be done by using the capacitance ratio discussed above. In block 234, the designer may then determine whether the calculated capacitance ratio is acceptable or not. This may be determined based on various factors including the speed of the integrated circuit. If the calculated capacitance ratio is acceptable (and if other parameters are also acceptable), then the integrated circuit may be manufactured having the prepared design in block 236. However, if the calculated capacitance ratio is not acceptable (or if the speed is not fast enough), then the designer may alter the design of the integrated circuit in block 238. As discussed above, this may be accomplished by different ways including the following: increasing a thickness of the buried oxide layer, decreasing a dielectric constant of the buried oxide layer and asymmetrically doping the source region and the drain region. The new capacitance ratio may then be calculated based on the altered design in block 232. Block 234 may then be repeated to determine whether the calculated capacitance ratio is acceptable or not. Operations may then proceed with either block 236 or 238 depending on the results of block 234.

In at least one embodiment, of the present invention an electronic device may be formed by calculating a capacitance ratio of the design of the electronic device and forming the electronic device having the calculated capacitance ratio. In at least one embodiment, a design may be evaluated of the electronic device and the design may be improved by increasing a capacitance ratio of the electronic device. Other embodiments of the present invention are also within the scope of the present invention.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. Various other modifications and changes may occur to those skilled in the art without departing from the spirit and scope of the invention.

We claim:

1. A method comprising:
   determining a capacitance ratio of a design of an integrated circuit, wherein said integrated circuit comprises a substrate, a buried oxide layer formed over said substrate, a source region formed over said buried oxide layer, a drain region formed over said buried oxide layer, and a body region formed over said buried oxide layer such that said body region is in between said source region and said drain region; and
   altering said design of said integrated circuit so as to increase said capacitance ratio of said integrated circuit.

2. The method of claim 1, wherein said capacitance ratio comprises:

$$C_{dj}/(C_{dj}+C_{sj}+C_{BOX}),$$

wherein $C_{dj}$ comprises a capacitance of a drain-body junction, $C_{sj}$ comprises a capacitance of a source-body junction and $C_{BOX}$ comprises a capacitance of said buried oxide layer.

3. The method of claim 1, wherein altering said design comprises increasing a thickness of said buried oxide layer.

4. The method of claim 1, wherein altering said design comprises decreasing a dielectric constant of said buried oxide layer.

5. The method of claim 1, wherein altering said design comprises asymmetrically doping said source region and said drain region.

6. A method comprising:
   calculating a capacitance ratio of a design for an integrated circuit, wherein said integrated circuit comprises a substrate, a buried layer formed over said substrate, a source region formed over said buried oxide layer, and a body region formed over said buried oxide layer such that said body region is in between said source region and said drain region;
   altering said design so as to increase said capacitance ratio; and
   forming said integrated circuit having said altered design.

7. The method of claim 6, wherein said capacitance ratio comprises:

$$C_{dj}/(C_{dj}+C_{sj}+C_{BOX}),$$

wherein $C_{dj}$ comprises a capacitance of a drain-body junction, $C_{sj}$ comprises a capacitance of a source-body junction and $C_{BOX}$ comprises a capacitance of said buried oxide layer.

8. The method of claim 7, wherein calculating said capacitance ratio comprises:
   determining a capacitance ratio of a first design of said integrated circuit.

9. The method of claim 8, wherein altering said design comprises increasing a thickness of said buried oxide layer.

10. The method of claim 8, wherein altering said design comprises decreasing a dielectric constant of said buried oxide layer.

11. The method of claim 8, wherein altering said design comprises asymmetrically doping said source region and said drain region.

12. A method comprising:
   evaluating a first design of an electronic device;
   improving said first design of said electronic device so as to increase a capacitance ratio of said electronic device, said capacitance ratio comprising:

$$C_{dj}/(C_{dj}+C_{sj}+C_{BOX}),$$

wherein $C_{dj}$ comprises a capacitance of a drain-body junction, $C_{sj}$ comprises a capacitance of a source-body junction and $C_{BOX}$ comprises a capacitance of said buried oxide layer.

13. The method of claim 12, wherein said electronic device comprises a substrate, a buried oxide layer formed over said substrate, a source region formed over said buried oxide layer, and a drain region formed over said buried oxide layer, and a body region formed over said buried oxide layer such that said body region is in between said source region and said drain region.

14. The method of claim 13, wherein improving said design comprises increasing a thickness of said buried oxide layer.

15. The method of claim 13, wherein improving said design comprises decreasing a dielectric constant of said buried oxide layer.

16. The method of claim 13, wherein improving said design comprises asymmetrically doping said source region and said drain region.

17. A method comprising:
   determining a capacitance ratio of a design of an integrated circuit, wherein said integrated circuit comprises a substrate, a buried oxide layer formed over said substrate, a source region formed over said buried oxide layer, a drain region formed over said buried oxide layer, and a body region formed over said buried oxide layer such that said body region is in between said source region and said drain region;
   altering said design of said integrated circuit so as to increase said capacitance of said integrated circuit; and
   forming said integrated circuit having said increased capacitance.

18. The method of claim 17, wherein said capacitance ratio comprises:

$$C_{dj}/(C_{dj}+C_{sj}+C_{BOX}),$$

wherein $C_{dj}$ comprises a capacitance of a drain-body junction, $C_{sj}$ comprises a capacitance of a source-body junction and $C_{BOX}$ comprises a capacitance of said buried oxide layer.

19. A method of forming an electronic device, said method comprising:
   calculating a capacitance ratio of a design for the electronic device, the calculating said capacitance ratio comprises:
      determining a capacitance ratio of a first design of said electronic device, and
      altering said first design of said electronic device so as to increase said capacitance ratio; and
   forming said electronic device having said calculated capacitance ratio.

20. The method of claim 19, wherein altering said design comprises increasing a thickness of a buried oxide layer.

21. The method of claim 19, wherein altering said design comprises decreasing a dielectric constant of a buried oxide layer.

22. The method of claim 19, wherein altering said design comprises asymmetrically doping a source region and a drain region.

23. The method of claim 1, further comprising forming the integrated circuit having the altered design.

24. A method of designing an electronic device comprising:
   determining a capacitance ratio of a design of said electronic device, wherein said electronic device comprises a substrate, a buried oxide layer formed over said substrate, a source region formed over said buried oxide layer, a drain region formed over said buried oxide layer, and a body region formed over said buried oxide layer such that said body region is in between said source region and said drain region; and
   altering said design of said electronic device so as to increase said capacitance ratio of said electronic device, the altering comprising increasing a thickness of the buried oxide layer of the electronic device.

25. A method of designing an electronic device comprising:
   determining a capacitance ratio of a design of said electronic device, wherein said electronic device comprises a substrate, a buried oxide layer formed over said substrate, a source region formed over said buried oxide layer, a drain region formed over said buried oxide layer, and a body region formed over said buried oxide layer such that said body region is in between said source region and said drain region; and
   altering said design of said electronic device so as to increase said capacitance ratio of said electronic device, the altering comprising decreasing a dielectric constant of the buried oxide layer of the electronic device.

26. A method of designing an electronic device comprising:
   determining a capacitance ratio of a design of said electronic device, wherein said electronic device comprises a substrate, a buried oxide layer formed over said substrate, a source region formed over said buried oxide layer, a drain region formed over said buried oxide layer, and a body region formed over said buried oxide layer such that said body region is in between said source region and said drain region; and
   altering said design of said electronic device so as to increase said capacitance ratio of said electronic device, the altering comprising asymmetrically doping the source region and the drain region of the electronic device.

* * * * *